United States Patent
Domingo

(10) Patent No.: US 7,702,710 B2
(45) Date of Patent: Apr. 20, 2010

(54) DIGITAL SIGNAL PROCESSOR OPTIMIZED FOR INTERPOLATION AND DECIMATION

(75) Inventor: Pablo Ventura Domingo, Valencia (ES)

(73) Assignee: Analog Devices, Inc., Norwood, MA (US)

( * ) Notice: Subject to any disclaimer, the term of this patent is extended or adjusted under 35 U.S.C. 154(b) by 1187 days.

(21) Appl. No.: 11/224,495

(22) Filed: Sep. 12, 2005

(65) Prior Publication Data

US 2006/0087466 A1   Apr. 27, 2006

Related U.S. Application Data

(60) Provisional application No. 60/609,085, filed on Sep. 10, 2004.

(51) Int. Cl.
*G06F 17/17* (2006.01)
(52) U.S. Cl. ..................................................... 708/313
(58) Field of Classification Search .................. 708/313
See application file for complete search history.

(56) References Cited

U.S. PATENT DOCUMENTS

| | | | | |
|---|---|---|---|---|
| 4,835,723 A * | 5/1989 | Hansen | ...................... | 708/313 |
| 6,489,997 B1 * | 12/2002 | Stapleton | .................... | 348/441 |
| 7,203,220 B2 * | 4/2007 | Baltersee et al. | ............ | 375/145 |
| 7,353,243 B2 * | 4/2008 | Scheuermann et al. | ...... | 708/319 |
| 2006/0291542 A1 * | 12/2006 | Medlock et al. | ............. | 375/148 |

\* cited by examiner

*Primary Examiner*—Tan V Mai
(74) *Attorney, Agent, or Firm*—Goodwin Procter LLP

(57) ABSTRACT

A digital signal processor receives samples of a first digital signal which is to be decimated and samples of a second digital signal which is to be interpolated. A digital signal processing engine performs a decimation function on samples of the first digital signal and an interpolation function on samples of the second digital signal on a time-shared basis. The digital signal processor has a first dual memory space for storing the samples of the first digital signal and a second dual memory space for storing the samples of the second digital signal. Outputs retrieved from a dual memory space are pre-added and applied to a multiplication and accumulation stage which operates on the pre-added outputs and a filter coefficient of a digital filter.

19 Claims, 6 Drawing Sheets

DIGITAL SIGNAL PROCESSOR OPTIMIZED FOR INTERPOLATION AND DECIMATION

FIELD OF THE INVENTION

This invention relates to performing decimation and interpolation functions, which may be required as part of an analog-to-digital converter and/or of a digital-to-analog converter.

BACKGROUND TO THE INVENTION

Analog-to-digital converters (ADCs) and digital-to-analog converters (DACs) are increasingly being based on a sigma-delta ($\Sigma\Delta$) architecture.

FIG. 1 illustrates a generalized architecture as used in a sigma delta analog-to-digital converter (ADC). An analog sigma-delta modulator 11 receives an analog input signal 10 and generates a high rate, low bitwidth, digital signal 12. This signal is applied to a digital decimation stage 13 which converts the signal to a low rate, high bitwidth, digital signal 14. The sigma-delta modulator 11 can be a single bit or multi-bit modulator.

FIG. 2 illustrates a generalized architecture as used in a sigma-delta digital-to-analog converter (DAC). A digital interpolation stage 21 receives an input digital signal 20 having a low rate and high bitwidth. The interpolation stage 21 generates a signal 22 having a high rate and high bitwidth by interpolating, i.e. calculating new samples to fit between the samples of the incoming digital signal. The interpolated signal 22 is applied to a digital sigma-delta modulator 23. The signal 24 output by the modulator 23 has a high rate and low bitwidth. Signal 24 is applied to a digital-to-analog conversion stage 25 which includes low pass filtering (not shown) to provide a smoothed analog output signal 26.

Conventionally interpolation (for sigma-delta DACs) and decimation (for sigma-delta ADCs) are each executed in different stages: one hardware structure for high conversion rate (typically 8 or 16), and one or more DSP controlled digital Finite Impulse Response (FIR) filters for high quality but a lower conversion rate (typically conversion rate of 2 on each filter). Optimised interpolation and decimation FIR processes are conventionally performed by separate DSP engines, each engine being optimised for one of the processes, since many of the optimisations seem incompatible between processes. Often, in digital signal processing applications such as audio codecs, there is a requirement for both an ADC and a DAC. Providing two separate, optimised, DSP engines for the decimation and interpolation processes incurs the penalties of requiring increased die space on an integrated circuit, increased cost and increased power requirements.

Accordingly, the present invention seeks to more efficiently provide a decimation and an interpolation function.

SUMMARY OF THE INVENTION

A digital signal processor comprises a first input for receiving samples of a first digital signal which is to be decimated and a second input for receiving samples of a second digital signal which is to be interpolated. A first memory space stores the samples of the first digital signal and a second memory space stores the samples of the second digital signal. A digital signal processing engine optimally performs a decimation function on samples of the first digital signal and an interpolation function on samples of the second digital signal on a time-shared basis. A first output outputs processed samples of the first digital signal and a second output outputs processed samples of the second digital signal.

A common digital signal processing engine is used both for decimation and interpolation. Avoiding the need for two separate DSP engines for these functions has the advantage of reducing die space on an integrated circuit, reducing cost and reducing power requirements. At any time, the DSP engine processes data for decimation or processes data for interpolation, and alternates between these functions. The digital signal processor can receive the first signal and second signal concurrently, or substantially concurrently, and similarly outputs processed signals concurrently, or substantially concurrently, since the time-sharing of the DSP engine occurs at a rapid rate. While the digital signal processing engine can perform both decimation of a first signal and interpolation of a second signal (as will be required, for example, in a codec which transmits and receives audio data), it can also perform just one of these functions if there is no need for the other, such as during an audio presentation application where there is only a need to convert digital audio data to analog form. Using separate memory spaces to store samples of the signals which are to be decimated and interpolated accommodates differences at which the data travels through memory for decimation and interpolation and thereby prevents overwriting of data. The digital signal processor merges processes on the same DSP engine, overcoming the incompatibilities between the processes and the usual optimised implementations.

The digital signal processor preferably has a first pair of memory units for storing the samples of the first digital signal and either a second pair of memory units, or a second addressing space in the same pair of memory units, for storing the samples of the second digital signal. In the following description the storage area for samples of the first digital signal will be called a first dual memory space and the storage area for samples of the second digital signal will be called a second dual memory space. A digital filtering function is performed on the samples using a set of filter coefficients, which are symmetrical with respect to a centre coefficient. The samples of the digital signal are distributed between the pair of memory units such that samples which are to be multiplied by the same filter coefficient are stored in different ones of a respective pair of memory units. This optimised arrangement allows samples which are to be multiplied by the same filter coefficient to be retrieved from different memory units, added by a pre-adder and multiplied by that filter coefficient, thus reducing the number of processing and storage operations required.

A common addressing unit generates addresses for accessing samples of signal data stored in both of the memory spaces. After each operational cycle when a filtering operation has been performed on a set of samples, the addresses are incremented (if needed) by varying the value of an offset generated by a counter. A single counter generates two outputs which respectively provide offsets depending on whether decimation or interpolation memory space is being accessed. Each counter output is achieved by taking a different sub-set of the total set of digits of the counter. Using a single counter has an advantage of saving the space of providing a second counter as part of the integrated circuit. Similarly, using one common addressing unit to access data in both memory spaces saves space on the integrated circuit.

The addressing unit generates a sequence of dual addresses for accessing the dual memory spaces and swaps dual addresses on alternate operational cycles. During a first operational cycle a sequence of dual addresses, each dual address comprising a first address and a second address, are respectively applied to a first memory and a second memory of a dual memory space. During a second operational cycle a sequence of dual addresses, each dual address comprising a first address and a second address, are respectively applied to a second memory and a first memory of a dual memory space. Both the first memory space (holding data to be decimated) and the second memory space (holding data to be interpolated) are addressed in this way.

The digital signal processor can operate on multiple first signals, such as a set of first signals representing stereo or multiple audio channels. The digital signal processor can also operate on multiple second signals.

The digital signal processor is mainly of use in analog-to-digital converters (ADCs) and digital-to-analog converters (DACs) but can also be used in any other kind of apparatus where there is a need for decimation and interpolation functions to be performed.

BRIEF DESCRIPTION OF THE DRAWINGS

Embodiments of the invention will be described with reference to the accompanying drawings in which.

DESCRIPTION OF PREFERRED EMBODIMENTS

Figure 1:
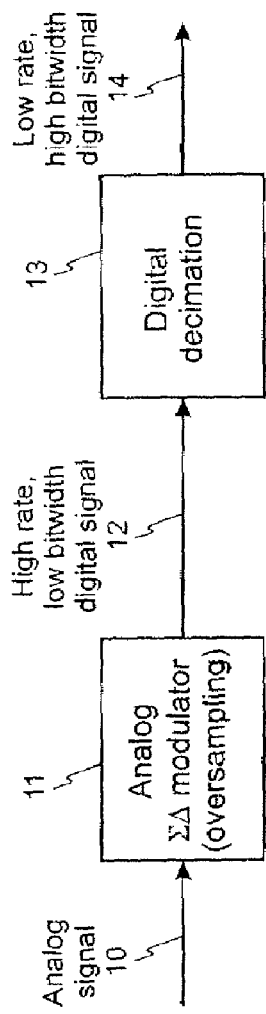
FIG. 1 shows the stages of a conventional sigma-delta analog-to-digital converter.

The present invention will be described with respect to particular embodiments and with reference to certain drawings but the invention is not limited thereto but only by the claims. The drawings described are only schematic and are non-limiting.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of the terms "including," "comprising," "having," "containing," or "involving," and variations thereof herein, is meant to encompass the items listed thereafter and equivalents thereof as well as additional items.

Figure 2:
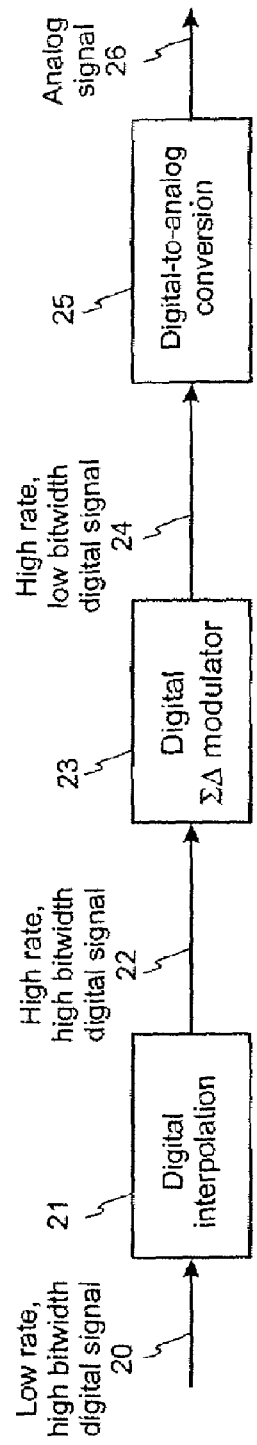
FIG. 2 shows the stages of a conventional sigma-delta digital-to-analog converter.
Figure 3:
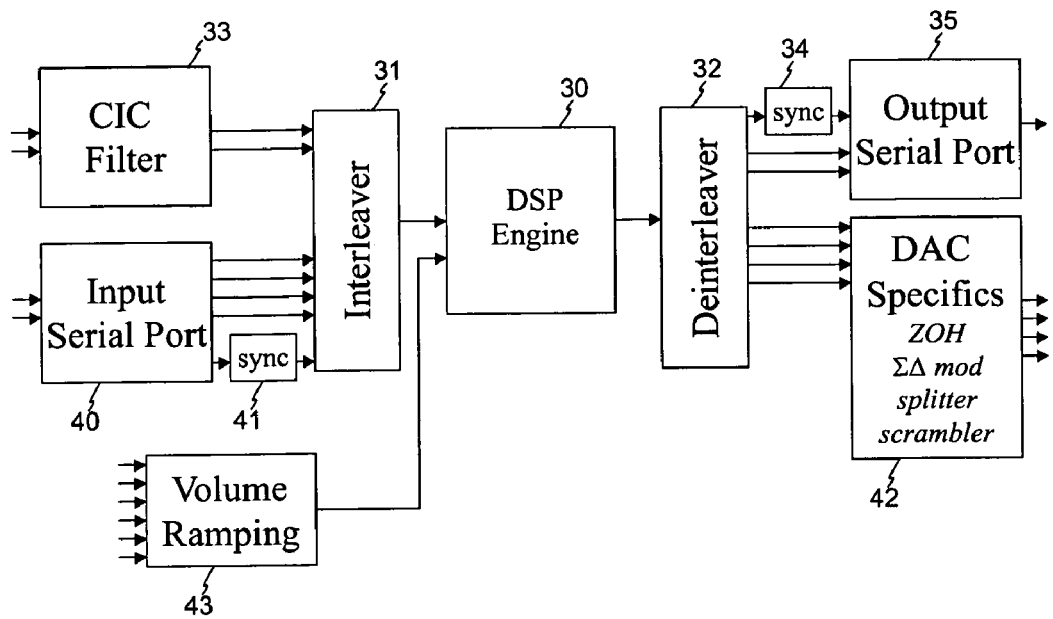
FIG. 3 shows a general system diagram where a DSP engine which performs optimised decimation and interpolation is used.

FIGS. 1 and 2, previously described, show the typical position of a decimation function within an overall analog-to-digital converter and of an interpolation function within an overall digital-to-analog converter. A block diagram of apparatus for performing a decimation and interpolation function, and having a common DSP engine, is shown in FIG. 3. The apparatus can form part of an audio codec or any other kind of apparatus which has a need for decimation and interpolation functions to be performed.

The output 12 from an ADC analog section (e.g. the output of the analog sigma-delta modulator 11 in FIG. 1) is applied to a hardware Cascaded Integrator Comb (CIC) filter 33 for a decimation operation in hardware (e.g. 16× decimation). As an interpolation function is usually performed at the beginning of a digital-to-analog converter the digital serial input 40 receives digital data 20 directly from a digital data source. In the example of digital data representing audio this can be 16 bit data words at a rate of 48 kHz. Digital data output by the CIC filter 33 (ADC channels) and digital data received via the input serial port 40 (DAC channels) are interleaved by an interleaver 31 before being applied to the DSP engine core 30.

The DSP engine core 30 is the DSP architecture where the FIR filtering processes are executed on all channels. As shown later, the main parts of the DSP engine core are a multiplier and accumulator (MACC), data RAM, coefficient ROM and a sequencer (instruction ROM).

The output of the DSP engine core 30 is deinterleaved 32 to the Output Serial Port 35 and DAC specifics unit 43. Decimated data (ADC outputs) are applied to the output serial port 35 to be sent to an external digital data device (e.g. general purpose digital signal processor, or data storage). Synchronisers 41, 34 are provided for safe data transfer between different clock domains, i.e. input serial port 40, clocked with the external input port clock, to DSP engine 30, clocked with the internal master clock. Similarly, DSP engine 30 to output serial port 35. Interpolated data (DAC outputs) are applied to the DAC Specifics block 43 for further processing as part of the DAC chain. The interpolated signals passing to the DAC specifics block 43 undergo a process of further interpolation with a hardware structure (e.g. 16× zero order hold, or linear interpolator), and some other signal conditioning prior to being sent to the DAC analog sections.

A single DSP engine 30 is shared by the ADC and DAC chains and performs a decimation function for the ADC chain and an interpolation function for the DAC chain. The DSP engine is controlled by a program with instructions. The program is read from a storage device (e.g. onboard ROM, known as a sequencer ROM) with a cyclic counter (program counter). The program counter, which controls the sequencer ROM, changes value every clock cycle. When all the instructions to process one sample of data are completed, the counter wraps around (e.g. every 512 clocks) and the whole sequencer repeats again. This represents one sequencer cycle.

The interleaver 31 loads all the outputs from the input data port 40 when such data is ready (controlled by input data port through the synchroniser 41). This data is treated as temporary storage in the interleaver block 31, and only updated to be visible when the engine core 30 has reached the end of the sequencer cycle (end of program counter). The interleaver uses a double buffering scheme with two banks of buffer registers. Data from one or more DAC channel inputs arrives via the serial input port 40 and is stored in a first register bank. Data is then transferred to a second register bank under the control of the DSP engine 30. Data from the ADC chain arrives from CIC filter 33. As the CIC filter will usually receive the same master clock as the DSP engine, the data output by the CIC filter 33 arrives in a controlled manner and can be applied directly to the second register bank. The DSP engine can then retrieve data from the second register bank on demand for transfer to decimation or interpolation memory space within the DSP engine 30.

Similarly, the deinterleaver 32 takes the output of the DSP engine 30 when it is ready, but keeps it in a temporary storage (register bank) until the output data port 35 requests a new sample to be transferred outside, which is governed by the output communication protocol.

Figure 4:
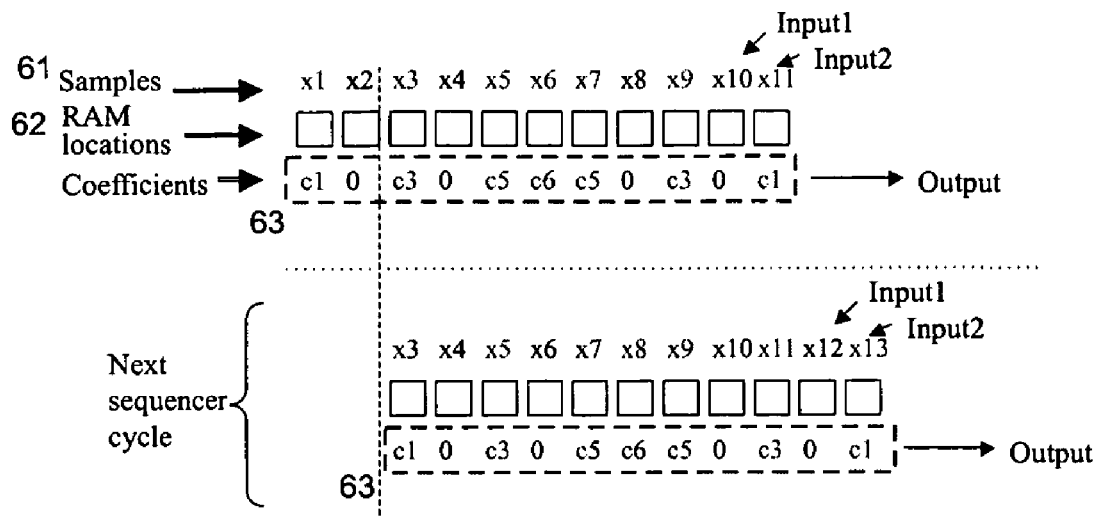
FIG. 4 shows a decimation operation on a sequence of data samples.

Optimised decimation and interpolation processes will now be described. Firstly, the optimised decimation process can be represented as shown in FIG. 4. The top line 61 shows a sequence of samples x1-x11. At each cycle, two new samples are applied as inputs to the DSP RAM and one sample is output, since this is a decimation process by two. Each RAM location stores data for one of the samples x1-x11. The lower line shows the set of filter coefficients 63 of the FIR filter that will be multiplied with the samples 61, with each filter coefficient aligned with an input sample. The set of filter coefficients 63 are stored in a separate ROM 36 and are retrieved on demand. In the first processing cycle each sample is multiplied with a corresponding filter coefficient and the resulting values are summed. In the next processing cycle there the scope of the filter advances by two RAM positions since there are two new samples x12, x13 to store. This process can be called optimised because it takes advantage of: i) the fact that the coefficients of the FIR filter are symmetrical with respect to the centre coefficient, and this allows performing pre-addition of data prior to the multiplication by the common coefficient, and ii) the fact that alternating coefficients except the central one are zero when using half-band filters ($w_{stop}=\pi-w_{pass}$) and for those filter coefficients of zero value, there is no need to perform the multiplication.

Figure 5:
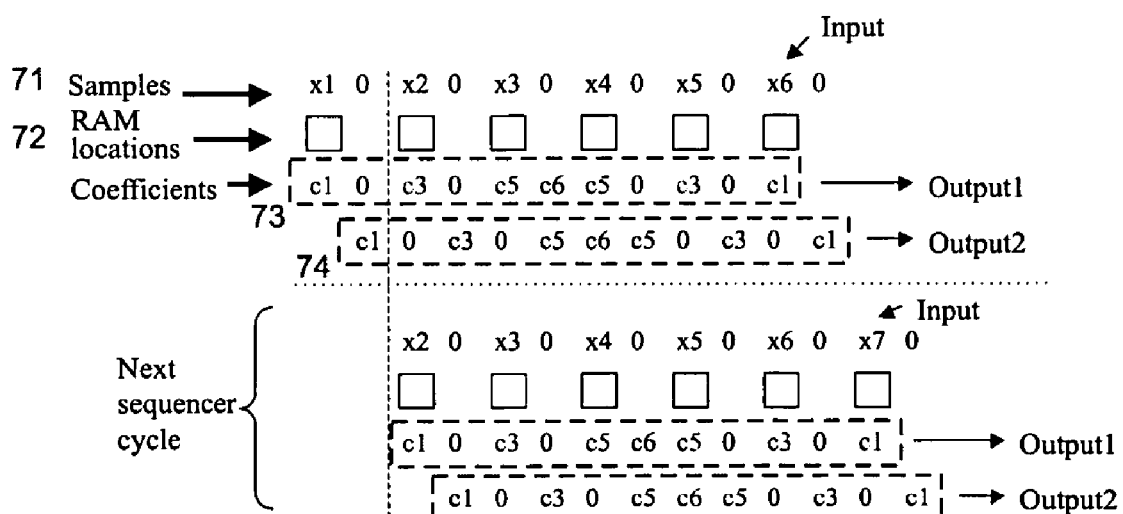
FIG. 5 shows an interpolation operation on a sequence of data samples.

The optimised interpolation process can be represented as shown in FIG. 5. The top line 71 shows a sequence of samples x1-x6. At each cycle, one new sample is applied as an input to the DSP RAM and there are two outputs since this is an interpolation process by two, i.e. creating one new sample between each pair of existing samples. Adjacent input samples are 'zero stuffed' but the zero valued samples are not stored in RAM. The lower two lines show a set of FIR filter coefficients that are multiplied with the sequence of samples. A first output is obtained by multiplying each sample with a respective coefficient in the upper line of coefficients 73 and the resulting values are summed. A second output is obtained by multiplying each sample with a respective coefficient in the lower line of coefficients 74 and the resulting values are summed. In the next processing cycle the scope of the filter advances by one RAM position since there is only one new sample, x7, to store. This process can be called optimised because it takes advantage of: i) the fact that the coefficients of the FIR filter are symmetrical with respect to the centre coefficient, and this allows performing pre-addition of data prior to the multiplication by the common coefficient, ii) the fact that alternating coefficients except the central one are zero when using half-band filters ($w_{stop}=\pi-w_{pass}$), and for those coefficients there is no need to perform multiplication, and iii) the fact that the "zero stuffing" samples are not stored in RAM (it can be seen that only the samples x1-x6 are stored in the RAM locations 72 of FIG. 5).

From the above overviews of the decimation and interpolation processes, it can be seen that data stored in RAM travels at different speeds for each of the optimised processes: by two RAM locations (each cycle) for decimation, but by one RAM location (each cycle) for interpolation.

Figure 6:
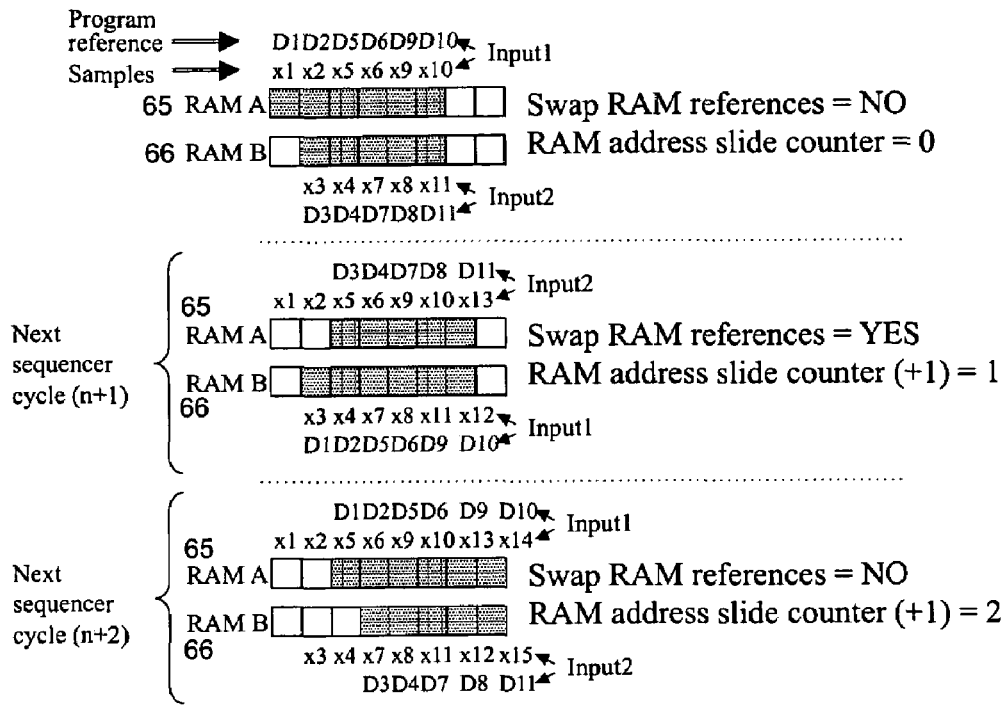
FIG. 6 shows how the decimation operation of FIG. 4 can be performed using two RAM units.

FIG. 6 shows the use of two RAM units to implement the decimation process previously shown in FIG. 4. Two RAMs—RAM A 65 and RAM B 66—are shown. The sequence of samples x1-x11 (corresponding to those shown in FIG. 4) are stored in, and distributed between, the two RAMs with samples x1, x2, x5, x6, x9, x10 in RAM A and samples x3, x4, x7, x8, x11 in RAM B. The distribution of samples is such that those samples which are to be multiplied by the same filter coefficient value are stored in different RAMs. This allows the samples to be added in a pre-adder before multiplication by the appropriate filter coefficient, thereby optimising processing. Memory locations in RAM are pointed to by pointers D1-D11. In this example the filter used in the decimation process has eleven filter coefficients, with coefficients c1, c3, c5, c6 taking non-zero values. In the first processing cycle the pointers D1-D11 point to the memory locations occupied by the samples that are to be operated on in that processing cycle. Pointers D1, D2, D5, D6, D9, D10 point to samples in RAM A and pointers D3, D4, D7, D8, D11 point to samples in RAM B. In the next processing cycle, shown in the middle section of FIG. 6, two new samples x12, x13 are stored in RAM and the pointers D1-D11 move to point to the memory locations occupied by the samples that are to be operated on in that processing cycle. Finally, in a further processing cycle shown in the lower section of FIG. 6, two new samples x14 x15 are stored in RAM and the pointers D1-D11 move to point to the memory locations occupied by the samples that are to be operated upon. It can be seen that between successive processing cycles, the pointers D1-D11 swap between RAM A and RAM B, i.e. pointers D1, D2, D5, D6, D9, D10 point to RAM A and pointers D3, D4, D7, D8, D11 point to RAM B during a first processing cycle. During the next processing cycle pointers D1, D2, D5, D6, D9, D10 point to RAM B and pointers D3, D4, D7, D8, D11 point to RAM A. In addition to swapping between RAM A and RAM B, the set of pointers advance (or 'slide') by one RAM position.

Figure 7:
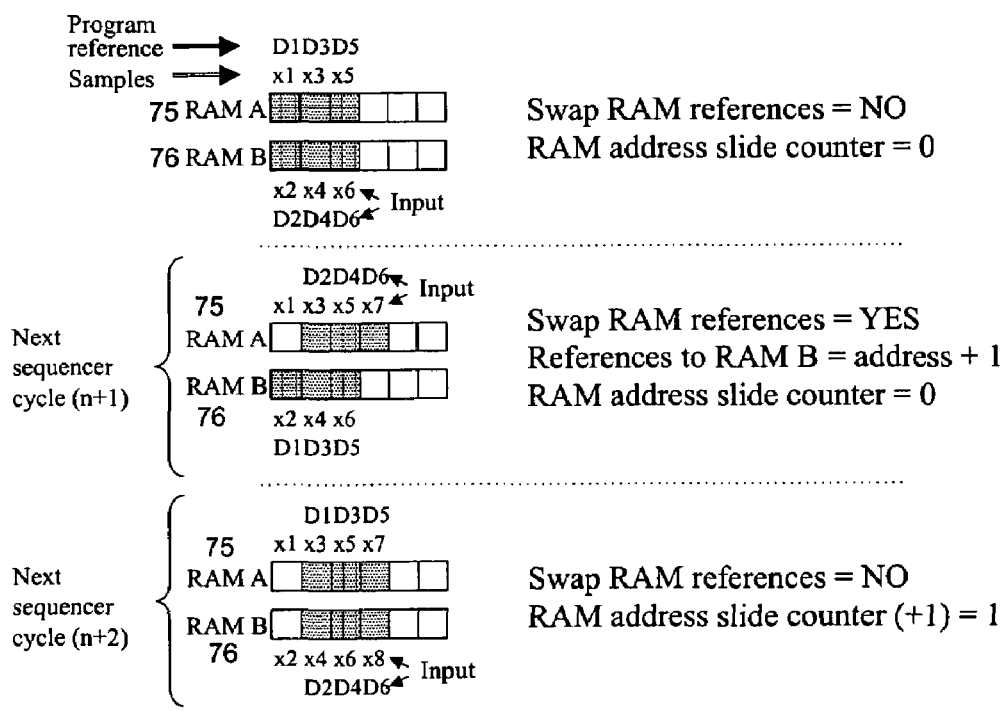
FIG. 7 shows how the interpolation operation of FIG. 5 can be performed using two RAM units.

FIG. 7 shows the use of two RAM units to implement the interpolation process previously shown in FIG. 5. Again, two RAMs—RAM A and RAM B—are shown. The sequence of samples x1-x6 (corresponding to those shown in FIG. 5) are stored in, and distributed between, the two RAMs, with samples x1, x3, x5 stored in RAM A and samples x2, x4, x6 stored in RAM B. The distribution of samples is such that those samples which are to be multiplied by the same filter coefficient value are stored in different RAMs. Memory locations in the RAMs are pointed to by pointers D1-D6. In a first processing cycle the pointers D1-D6 point to the memory locations occupied by the samples that are to be operated on in that processing cycle. Pointers D1, D3, D5 point to samples in RAM A and pointers D2, D4, D6 point to samples in RAM B. In the next processing cycle shown in the central part of FIG. 7, a new sample x7 is stored in RAM and the pointers D1-D6 move to point to the memory locations occupied by the samples that are to be operated on in that processing cycle. Finally, during a first processing cycle shown in the lower part of FIG. 7, a new sample x8 is stored in RAM and the pointers D1-D6 move to point to the memory locations occupied by the samples that are to be operated upon. It can be seen that between successive processing cycles, the pointers D1-D6 swap between RAM A and RAM B, i.e. pointers D1, D3, D5 point to RAM A and pointers D2, D4, D6 point to RAM B. During the next processing cycle pointers D1, D3, D5 point to RAM B and pointers D2, D4, D6 point to RAM A. However, the set of pointers does not advance by one at every processing cycle. Rather, pointers to RAM B are incremented by one on the same cycle as a swap occurs.

Figure 8:
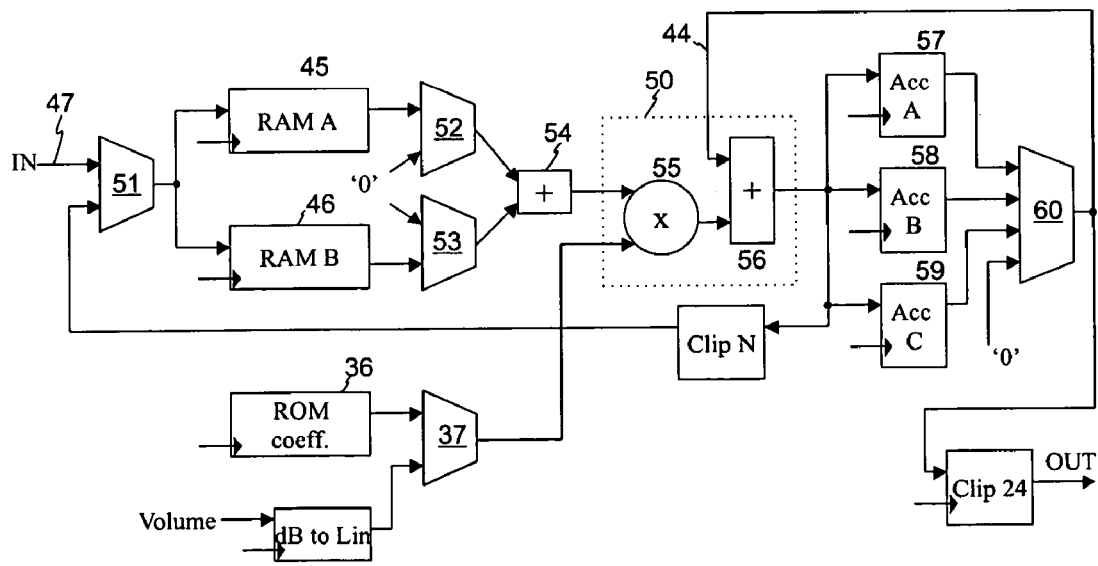
FIG. 8 shows the data path through the DSP engine of FIG. 3.

FIG. 8 shows a block diagram of the overall datapath section of the DSP engine to implement decimation and interpolation. The architecture uses a different data RAM space for each of the processes: one space for decimation data and another space for interpolation data, to accommodate the different data travelling speeds of the data and therefore prevent overwriting. The memory spaces 65, 66 and 75, 76 can be implemented as separate pairs of memory units, or by address partitioning of a single shared pair of memory units, with the decimation process using a first memory portion and the interpolation process using a second memory portion of each memory unit. A program with instructions (shown in FIG. 9) controls the RAM/ROM addresses, multiplexers, etc. After each sequencer cycle, the program repeats itself and the pointers (to data RAM addresses) are incremented to create a 'travelling' effect, without having to move all of the data held in memory. Each sequencer cycle will typically include a set of instructions for performing a decimation function on data stored in decimation memory space and a set of instructions for performing a decimation function on data stored in interpolation memory space. In order to take advantage of the dual RAM architecture, the 'travelling' data RAM is combined with a memory swap. The optimised processes described above with reference to FIGS. 6 and 7 are executed in this DSP architecture with two RAMs to exploit the symmetry of the FIR filters, and achieve 1 MACC operation per clock cycle. The samples that have to be multiplied by the same filter coefficient are pre-added by adder 54 before being applied to the multiplier and accumulator block (MACC) 50. This requires that the two samples to be added 54 are read from memory 45, 46 at the same time. Providing more than one accumulator 57, 58, 59 allows interruption of one filter processing with another without having to save the intermediate result in RAM, which would lose precision and one instruction cycle. This interruption is common in multistage decimation or interpolation since the long, higher quality, filters are interrupted by the short, lower quality, filters. Mux 60 selects which accumulator output is applied as an input 44 to the adder 56 of the MACC 50, also controlled by the instruction. Clip N and Clip 24 are saturation blocks used to restrict the range of the signal in case any overflow occurred after the arithmetical operations. Data is clipped to N if going to RAM and to 24 for output of the engine.

Figure 9:
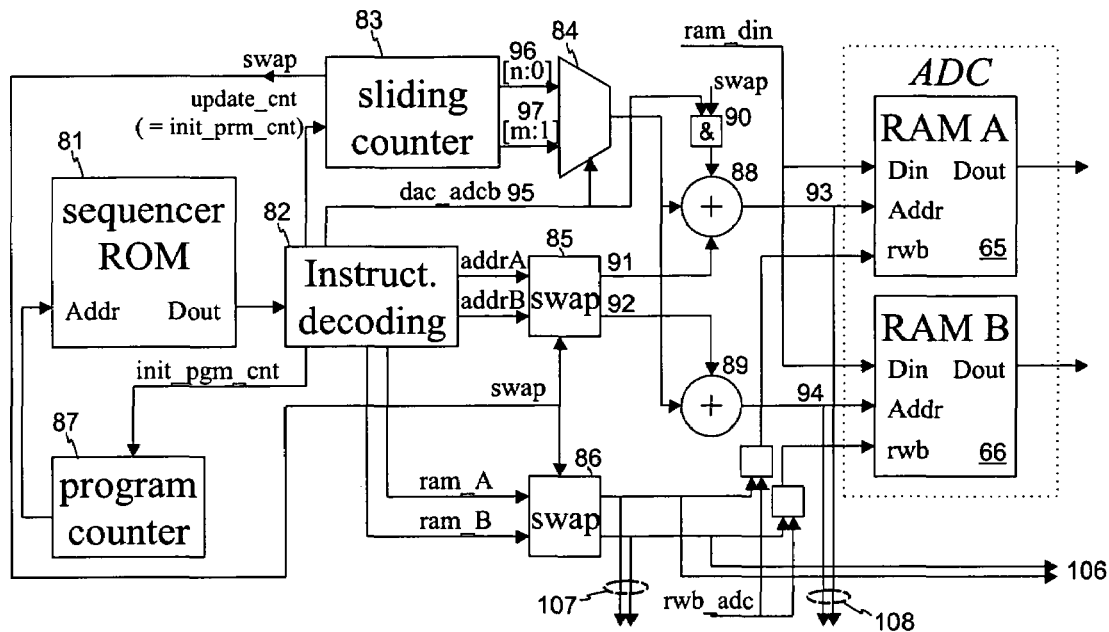
FIG. 9 shows part of the DSP engine of FIG. 3.
Figure 10:
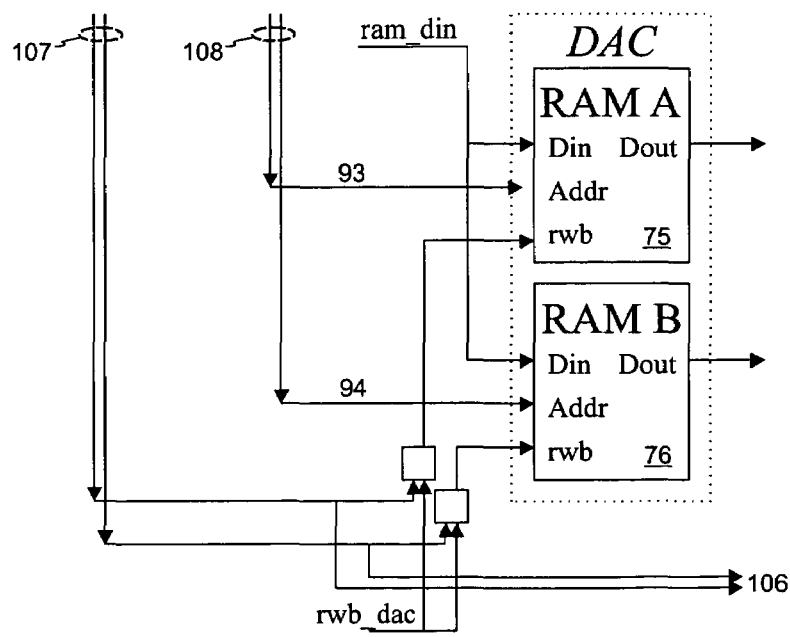
FIG. 10 shows a further part of the DSP engine of FIG. 9 including the RAM space for sample data which is to be interpolated.
Figure 12:
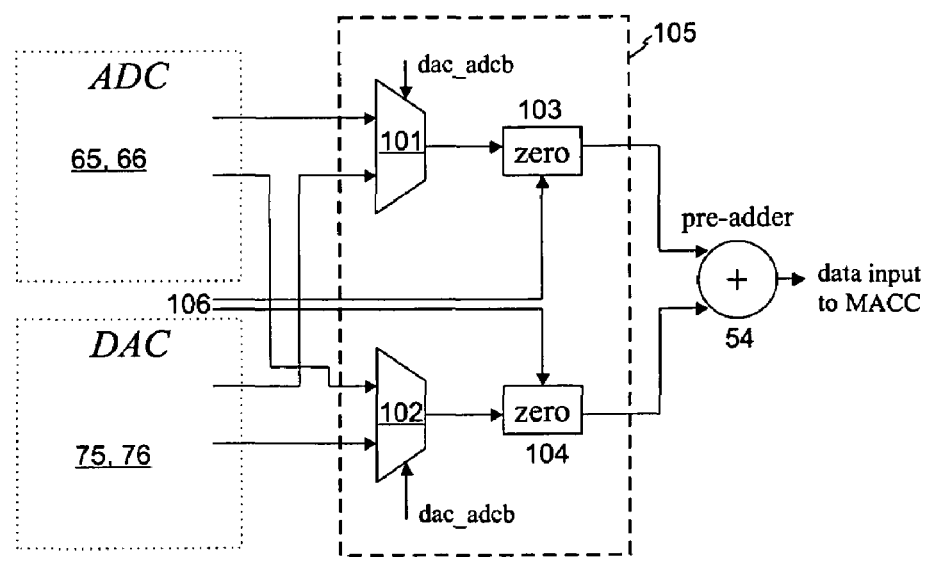
FIG. 12 shows an output section of the apparatus of FIG. 9.

FIGS. 9, 10 and 12 show a more detailed view of apparatus to perform the decimation and interpolation processes just described. FIG. 9 shows the main functional units and the memory spaces for the ADC decimation operation while FIG. 10 shows the memory spaces for the DAC interpolation operation. FIG. 12 shows the output section of the memories. Two memories 65, 66 store a set of sample values that represent a signal that is to be decimated, as previously shown in FIG. 6. A sequencer ROM 81 stores instructions for operating the DSP engine. Instructions are retrieved from an address within the ROM that is pointed to by a program counter 87. Retrieved instructions are decoded by an instruction decoding unit 82. Lines addrA and addrB are address pointers, i.e. pointers to addresses within RAM A and RAM B from which data should be retrieved. The lines addrA and addrB are applied to a swap function 85 which, on application of a swap input signal, swaps the order in which addrA and addrB lines are applied to subsequent stages, i.e. ordinarily addrA is output on line 91 and addrB is output on line 92 but on application of a swap signal addrA is output on line 92 and addrB is output on line 91. The address line 91 is summed, at summer 88, with an offset value output by counter 83. Similarly, address line 92 is summed, at summer 89, with an offset value output by counter 83. The instructions stored by sequencer ROM 81 represent the addresses of samples that are required to be retrieved for adding and multiplication by a filter coefficient and can represent the storage locations of samples x1-x11 shown in the top line of FIG. 6. During the sequencer cycle a sequence of pairs of addresses are output as addrA and addrB, e.g. the addresses of samples x1 and x11 in a first clock cycle, the addresses of samples x3 and x9 in another clock cycle. On subsequent sequencer cycles the sequencer ROM outputs the same sequence of pairs of addresses but the addresses are incremented by adding an offset value supplied by a counter (and the addresses may also be swapped between memory spaces) to achieve the travelling effect shown in the middle and lower lines of FIG. 6. Looking at pointer D1 as an example, in a first sequencer cycle the value of addrA output by the sequencer ROM corresponds to the storage location of sample x1 in RAM A and in a second sequencer cycle this is transformed to the storage location of sample x3 in RAM B.

Figure 11:
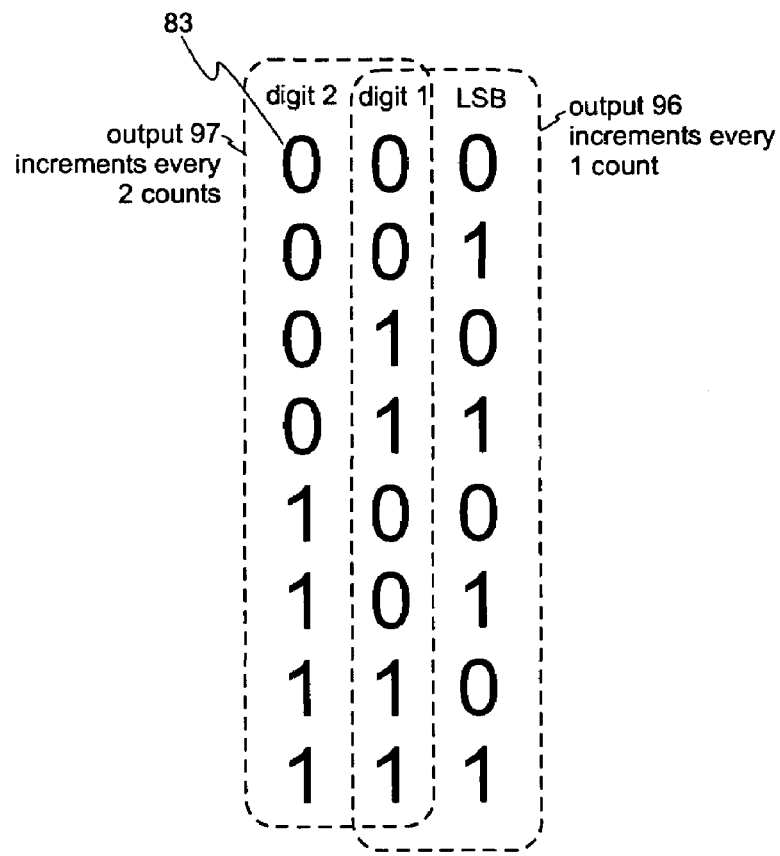
FIG. 11 shows the generation of two outputs from a single counter as a simplified example of what can be achieved using the counter within the apparatus of FIG. 9.

A single counter 83 is used to provide two outputs 96, 97. While separate counters could be used, it has been found that a single counter can be used to provide the two required outputs, with the advantages of reduced die space, cost and power. Sliding counter 83 outputs two values which are applied to multiplexer 84. FIG. 11 shows a very simplified three digit counter 83 to describe operation of the counter. The actual sliding counter will have a much larger number of digits. The sliding counter 83 provides two outputs 96, 97: a first output 96 which increments on each clock cycle 96 and a second output 97 which increments on every second clock cycle 97. The first output 96 has the range [n:0] which includes the LSB of the counter and the next n bits, giving a total of n+1 bits. The second output 97 has the range [m:1] which includes the bit of the counter in the position next to the LSB, which toggles every second clock, and the following bits up to the one in position m, giving a total of m bits. Both signals are applied to a multiplexer 84 for selection. The first output 96 is used to offset memory pointers for accessing decimation data, by summing the counter value with an address value at adders 88 and 89, and the second output 97 is used to offset memory pointers for accessing interpolation data, also by summing the counter value with an address value at adders 88 and 89. A line dac_adcb 95 is made high when an interpolation instruction is performed. The line 95 is applied to multiplexer 84 to select the appropriate counter range. Only one pair of RAMs (or RAM spaces) will be selected to act upon each type of instruction (interpolation or decimation) at any time. On alternate sequencer cycles the swap signal is made high. Since the internal sliding counter 83 always increments after each sequencer cycle, the least significant bit (LSB) of the sliding counter 83 can be used to signal the alternating RAM swap. The address range used for decimation or interpolation data can differ from one another. Accordingly, the counter offset to be applied to decimation data addresses (length n+1 bits) could have a greater range than the m bit offset applied to interpolation data addresses. Alternatively, the counter offset to be applied to decimation data addresses (length n+1 bits) could have a smaller range than the m bit offset applied to interpolation data addresses.

FIG. 10 shows two memory spaces 75, 76 which store a set of sample values for the DAC interpolation operation. As described above, memory spaces 75, 76 can be physically separate memory units from 65, 66 or a partitioned space in each of units 65, 66. As described above, RAM A, 75, receives the result of offsetting and/or swapping address pointers on input line 93, and RAM B 76 receives the result of offsetting and/or swapping address pointers on input line 94. For interpolation instructions the offsets increment every second sequencer cycle, controlled by multiplexer 84 previously described. Line 95 is also gated with a swap signal in an AND gate 90. Accordingly, when a swap occurs, the address pointers applied to RAM A (i.e. the pointers which were to RAM B but now swapped to point to RAM A) are incremented by one. This is to satisfy the condition labeled "Pointers to RAM B=address+1" in FIG. 7. On the next sequencer cycle the swap signal will be low, and thus the output of gate 90 is low and the address pointers will not be incremented. The same sequencer ROM 81, instruction decoding unit 82 and address lines addrA, addrB, 91, 92, 93, 94 are used to generate a sequence of addresses for accessing memories 75, 76 as are used to access memories 65, 66. Signal dac_adcb 95 selects whether decimation or interpolation data should accessed at any time. Signal dac_adcb 95 is applied to sliding counter 83 to cause the correct counter output 96, 97 to be added to the base addresses output on lines addrA, addrB. Signal dac_adcb 95 is also applied to an output stage (shown in FIG. 12 and described below) to ensure that, at any time, only data from the required memory space is transferred to pre-adder 54. When accessing decimation data signal dac_adcb 95 will cause counter output 96 to be added with the values of addrA, addrB and the outputs of memories 65, 66 will be transferred to the pre-adder 54. When accessing interpolation data signal dac_adcb 95 will cause output 97 to be added with the values of addrA, addrB and the outputs of memories 65, 66 will be transferred to the pre-adder 54.

It can be seen that the apparatus will achieve the required operation of swapping RAM pointers on each sequencer cycle and incrementing address pointers by one position (as previously shown in FIGS. 6 and 7).

Signals rwb_adc and rwb_dac along with signals ram_A and ram_B are used to select which of the RAMs (and/or RAM spaces) is to be selected to perform either a read or a write operation. New samples of a data signal are stored in memory by applying the data on line ram_din and selecting the appropriate memory spaces (ADC RAM or DAC RAM) via line rwb_adc, rwb_dac and the appropriate memory in each pair of memory units via lines ram_A, ram_B.

Those skilled in the art of decimation processes will realise that for multi-stage decimation it is convenient not to do the alternating swap on the first stages, in order to achieve a more optimal dual RAM access. The alternating RAM swapping can be disabled via the instruction code, for specific instructions. For this purpose signal 'swap' should also be applied to the instruction decoding block 82 to be gated whenever required by the instruction being decoded.

The output section of the apparatus shown in FIGS. 9 and 10 can be implemented as shown in FIG. 12. Signal dac_adcb 95 identifies whether an interpolation or decimation instruction is being performed and is applied as a control input to multiplexers 101, 102 to select appropriate inputs to the multiplexers 101, 102. During a decimation, instruction data will be retrieved from the ADC RAM spaces 65, 66 while during an interpolation instruction data will be retrieved from the DAC RAM spaces 75, 76. The appropriate data from either interpolation data RAM space or decimation data RAM space makes its way to the data input of the MACC. For most operations, a pair of data values are retrieved from RAM spaces, added by pre-adder 54, and applied to the MACC 50. Referring again to FIG. 4, the centre filter coefficient is multiplied by a single sample. No pre-adding should be performed in this case. This is accomplished activating the zero blocks 103 and 104 using signals 106 (see FIG. 9) which identify which RAM should be accessed during that cycle. If only RAM A should be accessed, a zero is generated in place of any output from RAM B. Similarly, if only RAM B should be accessed, a zero is generated in place of any output from RAM A. Block 105 in FIG. 12 corresponds to multiplexers 52, 53 in FIG. 8.

The embodiments in the invention described with reference to the drawings comprise a computer apparatus and/or processes performed in a computer apparatus or an integrated circuit. However, the invention also extends to computer programs, particularly computer programs stored on or in a carrier adapted to bring the invention into practice, for example on an integrated circuit. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a floppy disk or hard disk. The carrier may be an electrical or optical signal which may be transmitted via an electrical or an optical cable or by radio or other means.

The invention is not limited to the embodiments described herein, which may be modified or varied without departing from the scope of the invention.

The invention claimed is:

1. A digital signal processor comprising:
   a first input adapted to receive samples of a first digital signal which is to be decimated;
   a second input adapted to receive samples of a second digital signal which is to be interpolated substantially concurrently with the first digital signal;
   a first memory space for storing the samples of the first digital signal and a second memory space for storing the samples of the second digital signal;
   a digital signal processing engine which is arranged to perform a decimation function on samples of the first digital signal and, substantially concurrently therewith on a time-shared basis, an interpolation function on samples of the second digital signal;
   a first output for outputting processed samples of the first digital signal; and, a second output for outputting processed samples of the second digital signal.

2. A digital signal processor according to claim 1 wherein the first memory space is a dual memory space and the second memory space is a dual memory space.

3. A digital signal processor according to claim 2 which performs a digital filtering function on the samples of a respective digital signal using a set of symmetrical filter coefficients and wherein the samples of the digital signal are distributed across a respective dual memory space such that samples which are to be multiplied by the same filter coefficient are stored in different memories of a respective dual memory space.

4. A digital signal processor according to claim 3 further comprising a pre-adder which combines outputs retrieved from a respective dual memory space, and a multiplication and accumulation stage which operates on the pre-added outputs and a filter coefficient of the digital filter.

5. A digital signal processor according to claim 2 wherein the first and second dual memory spaces are accessed by a common addressing unit.

6. A digital signal processor according to claim 5 wherein the addressing unit generates a selection signal indicating whether data from the first dual memory space or second dual memory space should be accessed at any time, and the digital signal processor further comprises a selector which receives data inputs from the first dual memory space and the second dual memory space and is responsive to the selection signal to output data from a selected one of the dual memory spaces.

7. A digital signal processor according to claim 5 wherein the addressing unit is arranged to generate a sequence of dual base addresses and to sum the dual base addresses with a counter output to generate a dual address in a memory space from which data is to be retrieved.

8. A digital signal processor according to claim 7 wherein the addressing unit comprises a counter which is arranged to provide a first counter output which varies each operational cycle and a second counter output which varies every second operational cycle and wherein the addressing unit is arranged to sum the first counter output with a dual base address to form a dual address to access the first dual memory space and to sum the second counter output with a dual base address to form a dual address to access the second dual memory space.

9. A digital signal processor according to claim 8 wherein the counter comprises a set of counter digits which are ordered 0 (LSB), 1, ... N and wherein the first counter output comprises a sub-set of the counter digits starting at digit position 0 (LSB) and the second counter output comprises a sub-set of the counter digits starting at digit position 1.

10. A digital signal processor according to claim 5 wherein the addressing unit is arranged to generate a sequence of dual addresses for accessing the dual memory spaces and to swap dual addresses on alternate operational cycles, such that during a first operational cycle a sequence of dual addresses, each dual address comprising a first address and a second address, are respectively applied to a first memory and a second memory of a dual memory space, and during a second operational cycle a sequence of dual addresses, each dual address comprising a first address and a second address, are respectively applied to a second memory and a first memory of a dual memory space.

11. A digital signal processor according to claim 10 wherein the addressing unit is further arranged to increment the value of one of the dual addresses in each of a sequence of dual addresses when a swap occurs, only when accessing the second dual memory space.

12. A digital signal processor according to claim 11 wherein the addressing unit generates a swap signal to indicate that the dual address should be swapped and a second memory space access signal indicating that the second dual memory space is being accessed and wherein the addressing unit is further arranged to increment the value of one of the dual addresses in each of a sequence of dual addresses when both the swap signal and the second memory space access signal are enabled.

13. A digital signal processor according to claim 1 wherein zero-stuffing sample. values are not stored in the second memory space as part of the second digital signal which is to be interpolated.

14. A digital signal processor according to claim 1 which forms part of an analog-to digital converter which generates the first digital signal and a digital-to-analog converter which receives the second digital signal.

15. A digital signal processor according to claim 1 in the form of an integrated circuit.

16. An integrated circuit comprising:
a cascaded integrator comb for receiving samples of a first digital signal;
a serial port for receiving samples of a second digital signal; and,
a digital signal processor for performing a decimation function on samples of the first digital signal and, substantially concurrently therewith on a time-shared basis, an interpolation function on samples of the second digital signal.

17. The integrated circuit of claim 16 where the digital signal processor has a first memory space for storing the samples of the first digital signal and a second memory space for storing the samples of the second digital signal.

18. A method of processing a first digital signal and a second digital signal comprising:
receiving samples of the first digital signal which is to be decimated and storing those samples in a first memory space;
receiving samples of the second digital signal which is to be interpolated and storing those samples in a second memory space;
performing a decimation function on said stored samples of the first digital signal and, substantially concurrently therewith on a time-shared basis using a common digital signal processing engine, an interpolation function on said stored samples of the second digital signal;
outputting processed samples of the first digital signal as processed by the decimation function; and,
outputting processed samples of the second digital signal as processed by the interpolation function.

19. A computer program product comprising a computer-readable medium and, stored thereon, program instructions for causing a computer to perform a method of processing a first digital signal and a second digital signal, said method comprising:
receiving samples of the first digital signal which is to be decimated and storing those samples in a first memory space;
receiving samples of the second digital signal which is to be interpolated and storing those samples in a second memory space;
performing a decimation function on said stored samples of the first digital signal and, substantially concurrently therewith on a time-shared basis using a common digital signal processing engine, an interpolation function on said stored samples of the second digital signal;
outputting samples of the first digital signal as processed by the decimation function; and,
outputting samples of the second digital signal as processed by the interpolation function.

* * * * *